(12) United States Patent
Song et al.

(10) Patent No.: US 7,719,009 B2
(45) Date of Patent: May 18, 2010

(54) THIN FILM TRANSISTOR ARRAY PANEL AND METHOD OF MANUFACTURE

(75) Inventors: Keun-Kyu Song, Yongin-si (KR); Seong-Sik Shin, Seongnam-si (KR); Bo-Sung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 171 days.

(21) Appl. No.: 11/764,560

(22) Filed: Jun. 18, 2007

(65) Prior Publication Data

US 2008/0012011 A1    Jan. 17, 2008

(30) Foreign Application Priority Data

Jul. 11, 2006    (KR) ..................... 10-2006-0064700

(51) Int. Cl.
*H01L 29/04*    (2006.01)
(52) U.S. Cl. ................... 257/59; 257/E21.413
(58) Field of Classification Search ........... 257/40, 257/59, 72, E29.147, E29.151, E21.413
See application file for complete search history.

(56) References Cited

U.S. PATENT DOCUMENTS

| | | | | |
|---|---|---|---|---|
| 7,489,379 | B2* | 2/2009 | Ahn et al. | ............. 349/139 |
| 2006/0061702 | A1 | 3/2006 | Seo et al. | |
| 2006/0061707 | A1 | 3/2006 | Yano | |
| 2006/0145148 | A1* | 7/2006 | Hirai et al. | ............. 257/40 |
| 2006/0197884 | A1* | 9/2006 | Kim et al. | ............. 349/43 |
| 2006/0202199 | A1* | 9/2006 | Kim et al. | ............. 257/40 |

FOREIGN PATENT DOCUMENTS

| | | |
|---|---|---|
| JP | 2004-233956 | 8/2004 |
| JP | 2005-039086 | 2/2005 |
| JP | 2005-250055 | 9/2005 |
| JP | 2005-277065 | 10/2005 |
| JP | 2005-277238 | 10/2005 |
| KR | 1020000062886 | 10/2000 |
| KR | 1020050023012 | 3/2005 |
| KR | 1020050105852 | 11/2005 |
| KR | 1020060019976 | 3/2006 |

(Continued)

OTHER PUBLICATIONS

English Language Abstract, JP Patent First Publication No. 2005-250055, Sep. 15, 2005, 1 page.

(Continued)

*Primary Examiner*—David Vu
(74) *Attorney, Agent, or Firm*—Innovation Counsel LLP

(57) ABSTRACT

A thin film transistor array panel includes a gate line formed on a substrate, an interlayer insulating film formed on the gate line and having an opening, a gate insulator formed in the opening, a data line formed on the interlayer insulating film and including a first conductive layer made of a transparent conductive oxide and a second conductive layer made of a metal, a source electrode connected to the data line and made of a transparent conductive oxide, a drain electrode facing the source electrode and made of a transparent conductive oxide, a pixel electrode connected to the drain electrode, and an organic semiconductor contacting the source electrode and the drain electrode.

11 Claims, 17 Drawing Sheets

FOREIGN PATENT DOCUMENTS

KR    1020060024940    3/2006

OTHER PUBLICATIONS

English Language Abstract, JP Patent First Publication No. 2004-233956, Aug. 19, 2004, 1 page.
English Language Abstract, JP Patent First Publication No. 2005-039086, Feb. 10, 2005, 1 page.
English Language Abstract, JP Patent First Publication No. 2005-277065, Oct. 6, 2005, 1 page.
English Language Abstract, JP Patent First Publication No. 2005-277238, Oct. 6, 2005, 1 page.
English Language Abstract, KR Patent First Publication No. 1020000062886, Oct. 25, 2000, 1 page.
English Language Abstract, KR Patent First Publication No. 1020050023012, Mar. 9, 2005, 1 page.
English Language Abstract, KR Patent First Publication No. 1020050105852, Nov. 8, 2005, 1 page.
English Language Abstract, KR Patent First Publication No. 1020060019976, Mar. 6, 2006, 1 page.
English Language Abstract, KR Patent First Publication No. 1020060024940, Mar. 20, 2006, 1 page.

* cited by examiner

THIN FILM TRANSISTOR ARRAY PANEL AND METHOD OF MANUFACTURE

CROSS-REFERENCE TO RELATED APPLICATION

This application claims priority to and the benefit of Korean Patent Application No. 10-2006-0064700 filed in the Korean Intellectual Property Office on Jul. 11, 2006, the entire contents of which are incorporated herein by reference.

BACKGROUND OF THE INVENTION

1. Field of the Invention

The present invention relates to a thin film transistor array panel and a method for manufacturing the same.

2. Description of the Related Art

In general, flat panel display devices such as liquid crystal displays (LCDs), organic light emitting diode displays (OLED displays), electrophoretic displays, and the like include a plurality of pairs of electric field generating electrodes and an electro-optical active layer. A liquid crystal display includes a liquid crystal layer as the electro-optical active layer, and an organic light emitting display includes an organic light emitting layer as the electro-optical active layer.

One of electric field generating electrodes forming a pair is usually connected to a switching element and receives an electrical signal, and the electro-optical active layer converts the electrical signal into an optical signal, thereby displaying an image.

A flat panel display device uses a thin film transistor (TFT), which is a three-terminal device, as a switching device. Gate lines transmitting scan signals for controlling the thin film transistor and data lines transmitting signals to be applied to pixel electrodes are provided on the flat panel display device.

Organic thin film transistors (OTFTs), including organic semiconductors instead of inorganic semiconductors such as silicon (Si) can be easily produced into fiber or film shapes and can be employed as a core element of a flexible display device.

Organic thin film transistors can be fabricated by means of a solution process such as inkjet printing and can be easily adapted to larger area flat panel display devices than can be achieved by a deposition process alone.

However, organic semiconductors may be easily damaged in subsequent processes because they have less heat resistance and lower resistance to process chemicals than inorganic semiconductors. When source and drain electrodes are made of low resistance conductive materials such as aluminum (Al), a Schottky barrier is formed between the organic semiconductor and the source and drain electrodes, thereby degrading the thin film transistor characteristics.

Consequently, in order to protect organic semiconductors and prevent the characteristics of an organic thin film transistor from being degraded, many more lamination structures and subsequent additional procedures as well as additional masks are required which drastically increases the manufacturing cost.

SUMMARY OF THE INVENTION

The present invention, according to one of its aspects, reduces the number of masks required to manufacture an organic thin film transistor while providing organic semiconductors and an organic thin film transistor having improved stability.

According to one exemplary embodiment of the present invention, there is provided a thin film transistor array panel, including: a gate line formed on a substrate; an interlayer insulating film formed on the gate line and having an opening; a gate insulator formed in the opening; a data line formed on the interlayer insulating film and including a first conductive layer made of a transparent conductive oxide and a second conductive layer made of a metal; a source electrode connected to the data line and made of a transparent conductive oxide; a drain electrode facing the source electrode and made of a transparent conductive oxide; a pixel electrode connected to the drain electrode; and an organic semiconductor contacting the source electrode and the drain electrode.

The transparent conductive oxide may be ITO or IZO.

The metal may include at least one of molybdenum (Mo), a molybdenum alloy, chromium (Cr), a chromium alloy, aluminum (Al), an aluminum alloy, copper (Cu), a copper alloy, silver (Ag), and a silver alloy.

The opening may include a first opening and a second opening that is larger than the first opening, and the first opening and the second opening may have the gate insulator and the organic semiconductor, respectively, formed therein.

The thin film transistor array panel may further include a protective member covering the organic semiconductor.

According to another exemplary embodiment of the present invention, there is provided a thin film transistor array panel, including: a gate line formed on a substrate and including a gate electrode; a data line intersecting the gate line and including a first conductive layer and a second conductive layer; a source electrode connected to the data line; a pixel electrode including a drain electrode facing the source electrode; and an organic semiconductor contacting the source electrode and the drain electrode, the first conductive layer of the data line, the source electrode, and the pixel electrode containing the same material.

The first conductive layer and the second conductive layer may be made from materials with different etching selectivity ratios.

The first conductive layer of the data line, the source electrode, and the pixel electrode comprises a transparent conductive oxide, and the second conductive layer may be made of a metal.

The thin film transistor array panel may include an interlayer insulating film formed between the gate line and the data line, the interlayer insulating film having a first opening and a second opening that is larger than the first opening.

The thin film transistor array panel may further include a gate insulator formed in the first opening and contacting the gate electrode, the source electrode, and the drain electrode, and the organic semiconductor may be disposed in the second opening.

According to one exemplary embodiment of the present invention, there is provided a method for manufacturing a thin film transistor array panel, including: forming a gate line on a substrate; forming an interlayer insulating film on the entire surface of the substrate including the gate line; forming an opening in the interlayer insulating film; forming a gate insulator in the opening; sequentially forming a first conductive layer made of a transparent conductive oxide and a second conductive layer made of a metal on the interlayer insulating film and the gate insulator; sequentially photo-etching the second conductive layer and the first conductive layer to form a data line and conductive members separate from the data line; removing part of the data line and the second conductive layer of the conductive members to form a pixel electrode including a drain electrode and a source electrode; and forming an organic semiconductor contacting the source electrode and the drain electrode.

The forming of an opening may include exposing the interlayer insulating film by using a mask having a shielding region, a transmissive region, and a semi-transmissive region.

The forming of a data line and the conductive members and the forming of a pixel electrode and a source electrode may be carried out by using one mask.

The mask may have a shielding region, a transmissive region, and a semi-transmissive region.

The forming of a data line and the conductive members includes: forming a photoresist film on the second conductive layer; forming a first photoresist pattern and a second photoresist pattern that is thinner than the first photoresist pattern by exposing the photoresist film by using the mask; and etching the second conductive layer and the first conductive layer by using the first photoresist pattern and the second photoresist pattern.

The forming of a pixel electrode and a source electrode includes removing the second photoresist pattern, and etching the second conductive layer of the conductive members by using the first photoresist pattern.

At least one of the forming of a gate insulator and the forming of an organic semiconductor may be carried out by an inkjet printing method.

According to another exemplary embodiment of the present invention, there is provided a method for manufacturing a thin film transistor array panel, including: forming a gate line on a substrate; forming an interlayer insulating film having an opening on the gate line; forming a gate insulator in the opening; forming a data line including a source electrode and a pixel electrode including a drain electrode on the interlayer insulating film; and forming an organic semiconductor on the source electrode and the drain electrode. The gate line is formed by using a first mask, the interlayer insulating film is formed by using a second mask, and the data line including the source electrode and the pixel electrode including the drain electrode is formed by using a third mask.

At least one of the forming of a gate insulator and the forming of an organic semiconductor may be carried out by an inkjet printing method.

The forming of a data line including a source electrode and a pixel electrode including a drain electrode includes sequentially forming first and second conductive layers with different etching selectivity ratios, sequentially etching the second conductive layer and the first conductive layer to expose part of the gate insulator, and partially etching the second conductive layer. In the partial etching of the second conductive layer, the portion where the second conductive layer remains may be the data line, and the portion where the second conductive layer is removed may be the source electrode, the drain electrode, and the pixel electrode.

DETAILED DESCRIPTION OF THE EMBODIMENTS

Figure 1:
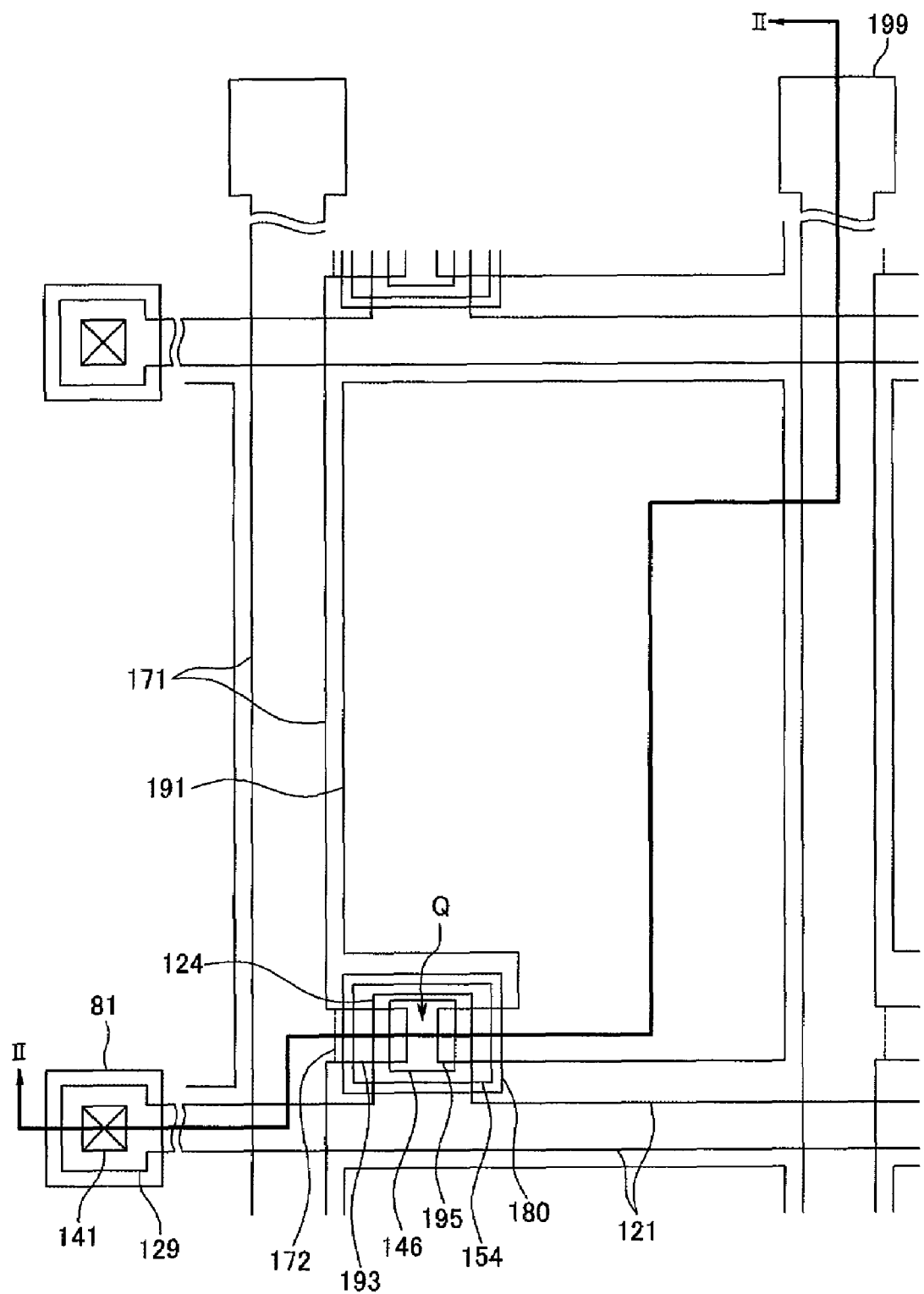
FIG. 1 is a layout view of a thin film transistor array panel according to one exemplary embodiment of the present invention.

Hereinafter, exemplary embodiments of the present invention will be described in detail with reference to the accompanying drawings in such a manner that they can be readily implemented by those skilled in the art.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a thin film transistor array panel according to one exemplary embodiment of the present invention will be described in detail with reference to FIGS. 1 and 2.

Figure 2:
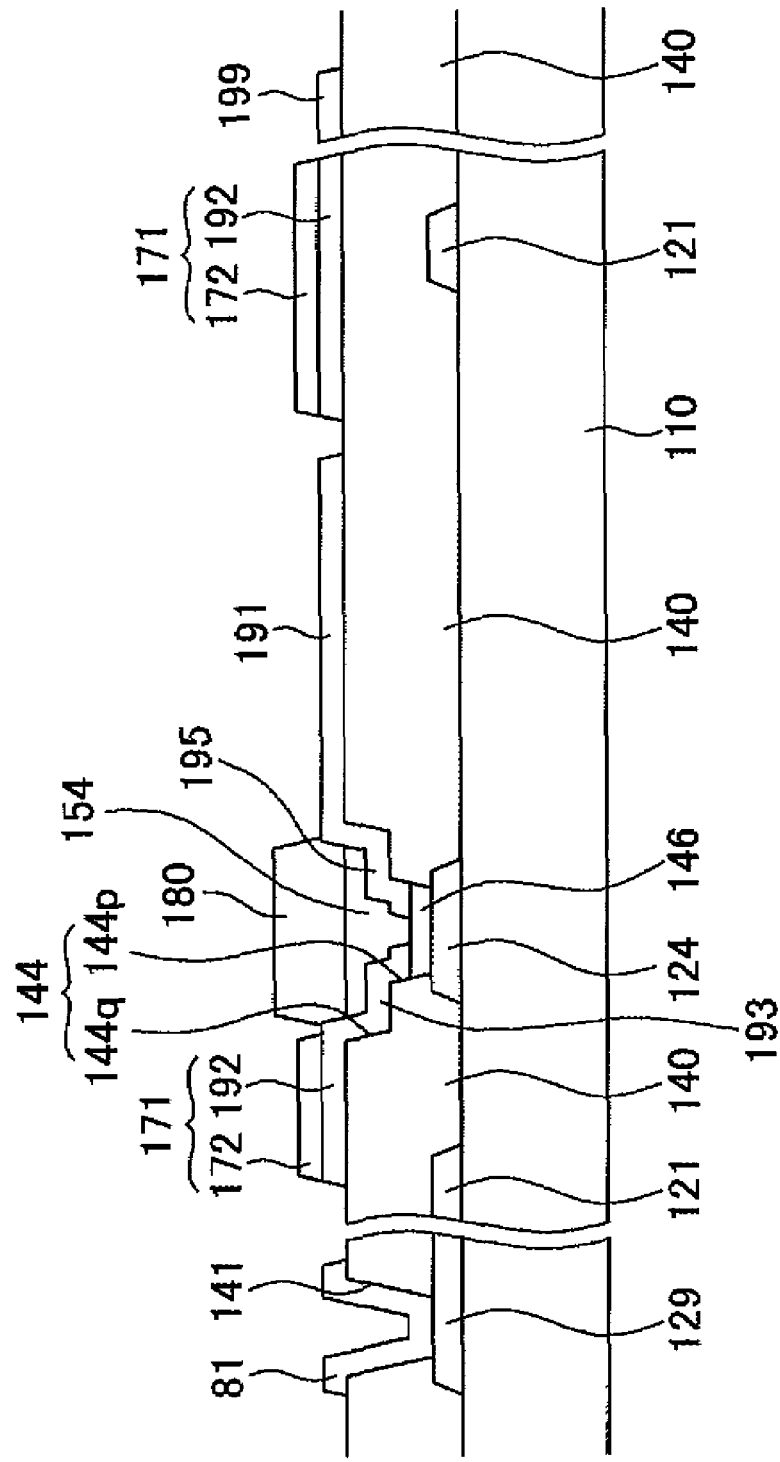
FIG. 2 is a cross-sectional view taken along line II-I of the thin film transistor array panel of FIG. 1.

FIG. 1 is a layout view of a thin film transistor array panel according to one exemplary embodiment of the present invention, and FIG. 2 is a cross-sectional view taken along line II-I of the thin film transistor array panel of FIG. 1.

A plurality of gate lines 121 are formed on an insulating substrate 110 made of transparent glass, silicon, or plastic.

The gate lines 121 transmit gate signals and extend substantially in a transverse direction. Each gate line 121 includes a plurality of gate electrodes 124 projecting upward and an end portion 129 having a large area for contact with another layer or an external driving circuit. A gate driving circuit (not shown) for generating the gate signals may be mounted on a flexible printed circuit film (not shown), which may be attached to the insulating substrate 110, directly mounted on the substrate 110, or integrated onto the insulating substrate 110. The gate lines 121 may extend to be directly connected to a gate driving circuit that may be integrated onto the insulating substrate 110.

Lateral sides of the gate lines 121 are preferably inclined relative to a surface of the insulating substrate 110 at an angle ranging from about 30° to 80°.

An interlayer insulating layer 140 is formed on the entire surface of the substrate 110 including the gate lines 121. The interlayer insulating film 140 may be made of a photosensitive organic material that can be subjected to a solution process, and its thickness may arrange from about 5000 Å to 4 µm.

The interlayer insulating film 140 has a plurality of openings 144 and a plurality of contact holes 141. The openings 144 includes lower openings 144p exposing the gate electrodes 124 and upper openings 144q disposed thereon. The lower openings 144p and the upper openings 144q are formed in a stepwise manner, and the upper openings 144q are larger than the lower openings 144*p*. The contact holes 141 expose end portions 129 of the gate lines 121.

A gate insulator 146 is formed in the lower openings 144*p*. The interlayer insulating film 140 surrounding the lower openings 144*p* serves as a bank for confining the gate insulator 146 therein.

The gate insulator 146 may be made of an organic material or an inorganic material. Examples of this organic material include solution polymer such as polyimide, polyvinyl alcohol, fluorane-containing compounds, and parylene. Examples of this inorganic material include silicon oxide ($SiO_2$) surface-treated with octadecyl trichloro silane (OTS).

Data lines 171, pixel electrodes 191, and contact assistants 81 are formed on the gate insulator 146 and the interlayer insulating film 140.

The data lines 171 transmit data signals and extend substantially in a longitudinal direction. Each data line 171 includes a source electrode 193 projecting laterally, and an end portion 199 having a large area for contact with another layer or an external driving circuit. A data driving circuit (not shown) for generating the data signals may be mounted on an FPC film (not shown), which may be attached to the insulating substrate 110, directly mounted on the insulating substrate 110, or integrated onto the insulating substrate 110. The data lines 171 may extend to be directly connected to a driving circuit that may be integrated onto the insulating substrate 110.

The source electrode 193 is formed in part of the opening 144 of the interlayer insulating film 140 and contacted with the gate insulator 146 in the opening 144.

The portion of the data line 171 excluding the source electrode 193 and the end portion 199 is formed in a double layer including an upper data line 172 and a lower data line 192.

The upper data line 172 may be made of a low resistance metal, such as molybdenum (Mo), a molybdenum alloy, chromium (Cr), a chromium alloy, aluminum (Al), an aluminum alloy, copper (Cu), a copper alloy, silver (Ag), and a silver alloy. The lower data line 192 may be made of a transparent conductive oxide such as indium tin oxide (ITO) or indium zinc oxide (IZO). The upper data line 172 and the lower data line 192 must have a different etching selectivity ratio.

The source electrode 193 and the end portion 199 are single layers made of a transparent conductive oxide such as ITO or IZO.

The pixel electrode 191 includes a portion (hereinafter, "drain electrode") 195 facing the source electrode 193, and is made of a transparent conductive oxide such as ITO or IZO. The pixel electrode 191 receives data signals from the drain electrode 195. The pixel electrode 191 supplied with a data voltage determines the orientation of liquid crystal molecules in a liquid crystal layer (not shown) between two electrodes, or causes an electric current to flow through a light emitting layer (not shown) to emit light by generating an electric field together with a common electrode (not shown) facing the pixel electrode 191 and receiving a common voltage.

The drain electrode 195 faces the source electrode 193 on the gate insulator 146.

The contact assistants 81 are connected to the end portions 129 of the gate lines 121 through the contact holes 141, and protect the end portions 129 and enhance adhesion between the end portions 129 of the gate lines 121 and external devices.

Lateral sides of the gate lines 171, pixel electrodes 191, and contact assistants 81 are preferably inclined relative to a surface of the insulating substrate 110 at an angle ranging from about 30° to 80°.

An organic semiconductor 154 is formed in the upper openings 144*q*.

Organic semiconductor 154 is in contact with the source electrode 193 and the drain electrode 195 in the upper openings 144*q*, and overlaps the gate electrodes 124.

Organic semiconductor 154 may include a high molecular compound or a low molecular compound that is soluble in an aqueous solution or organic solvent.

Organic semiconductor 154 may be made of, or from derivatives of, tetracene or pentacene with substituents. Alternatively, the organic semiconductor 154 may be made of oligothiophene including four to eight thiophenes connected at the positions 2, 5 of thiophene rings.

Organic semiconductor 154 may be made of polythienylenevinylene, poly-3-hexylthiophene, polythiophene, phthalocyanine, metallized phthalocyanine, or halogenated derivatives thereof. Organic semiconductor 154 may be made of perylenetetracarboxylic dianhydride (PTCDA), naphthalenetetracarboxylic dianhydride (NTCDA), or their imide derivatives. Organic semiconductor 154 may be made of perylene, coronene, or derivatives thereof with substituents.

Organic semiconductor 154 may have a thickness of about 300 to 1 μm.

One gate electrode 124, one source electrode 193, and one drain electrode 195 along with the organic semiconductor 154 form one thin film transistor. The channel of the thin film transistor (Q) is formed in organic semiconductor 154 between the source electrode 193 and the drain electrode 195. The portions facing the source electrode 193 and the drain electrode 195 may be formed in a snake-like shape so that the electrical current characteristics can be enhanced by an increase of the channel width.

A protective member 180 is formed on organic semiconductor 154. Protective member 180 may be made of an organic material or an inorganic material. Examples of the organic material may include a fluorine-containing polymer or parylene that can be formed at a room temperature or low temperature. Examples of the inorganic material may include ITO or IZO. The protective member 180 prevents the organic semiconductor 154 from being damaged in the manufacture process.

As described above, according to one exemplary embodiment of the present invention, the data line 171 includes an upper conductive layer 172 made of a low resistance metal such as Al, and thus is able to prevent a signal delay and a voltage drop by reducing the resistance.

The source electrode 193 and drain electrode 195 in direct contact with the organic semiconductor 154 are made of a conductive material, such as ITO or IZO having not too large a work function difference from that of the organic semiconductor. Because no Schottky barrier is formed, unlike the case in which the source electrode 193 and the drain electrode 195 are made of a low resistance metal, carrier injection and transport are made easy. Consequently, the characteristics of the organic thin film transistor are enhanced.

Now, a method for manufacturing the thin film transistor shown in FIGS. 1 and 2 will be described in detail with reference to FIGS. 3 to 17.

Figure 10:
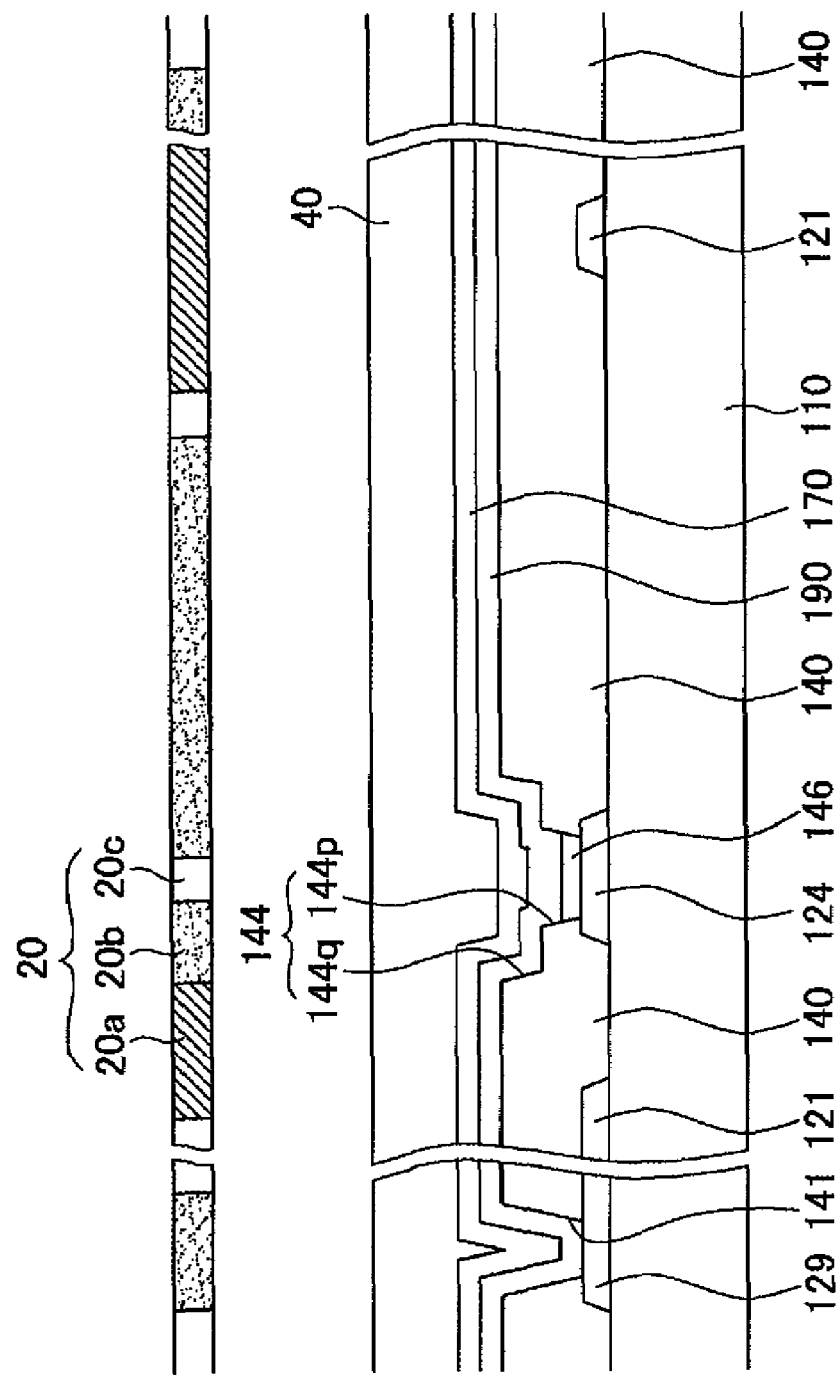
FIGS. 10 and 11 are cross-sectional views showing a continuous process of the thin film transistor of FIGS. 8 and 9.
Figure 11:
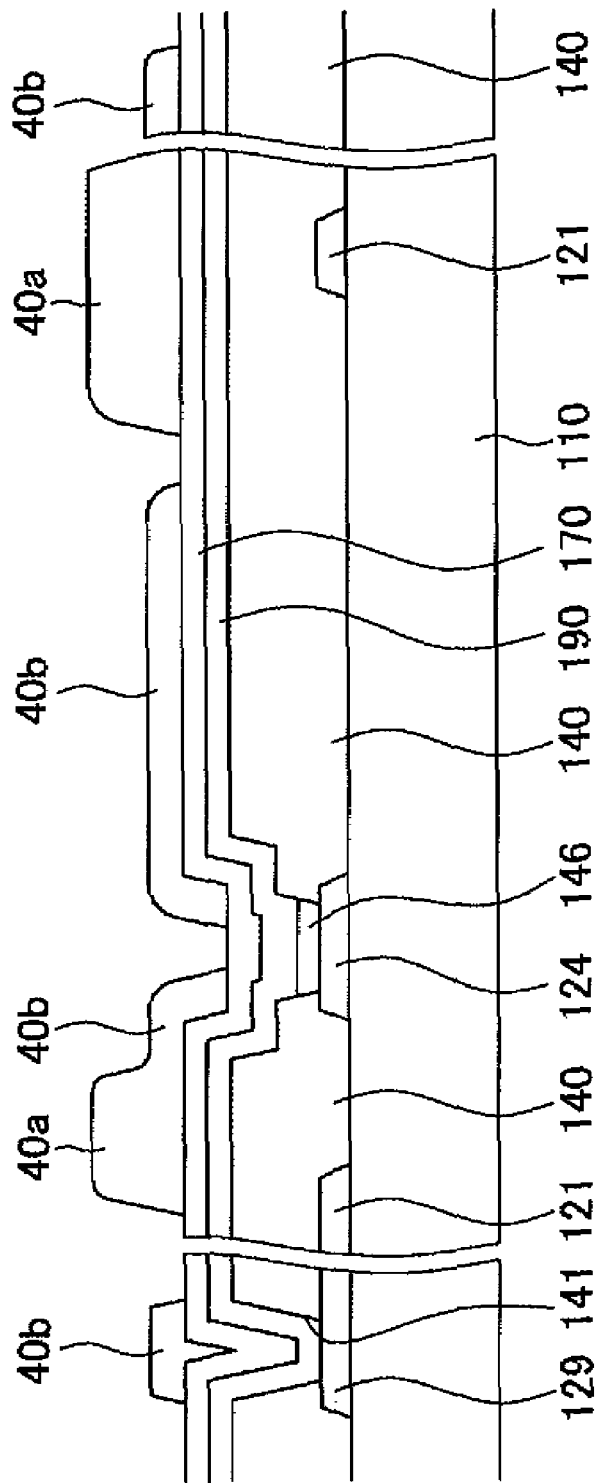

FIG. 3, FIG. 6, FIG. 8, FIG. 12, FIG. 14, and FIG. 16 are layout views showing a method for manufacturing the thin film transistor array panel of FIGS. 1 and 2 according to one exemplary embodiment of the present invention. FIG. 4 is a cross-sectional view taken along line IV-IV of the thin film transistor array panel of FIG. 3. FIG. 5 is a cross-sectional view showing a continuous process of the thin film transistor array panel of FIGS. 3 and 4. FIG. 7 is a cross-sectional view taken along line VII-VII of the thin film transistor array panel of FIG. 6. FIG. 9 is a cross-sectional view taken along line IX-IX of the thin film transistor array panel of FIG. 8. FIGS. 10 and 11 are cross-sectional views showing a continuous process of the thin film transistor of FIGS. 8 and 9. FIG. 13 is a cross-sectional view taken along line XIII-XIII of the thin film transistor array panel of FIG. 12. FIG. 15 is a cross-sectional view taken along line XV-XV of the thin film transistor array panel of FIG. 14. FIG. 17 is a cross-sectional view taken along line XVII-XVII of the thin film transistor array panel of FIG. 16.

Figure 3:
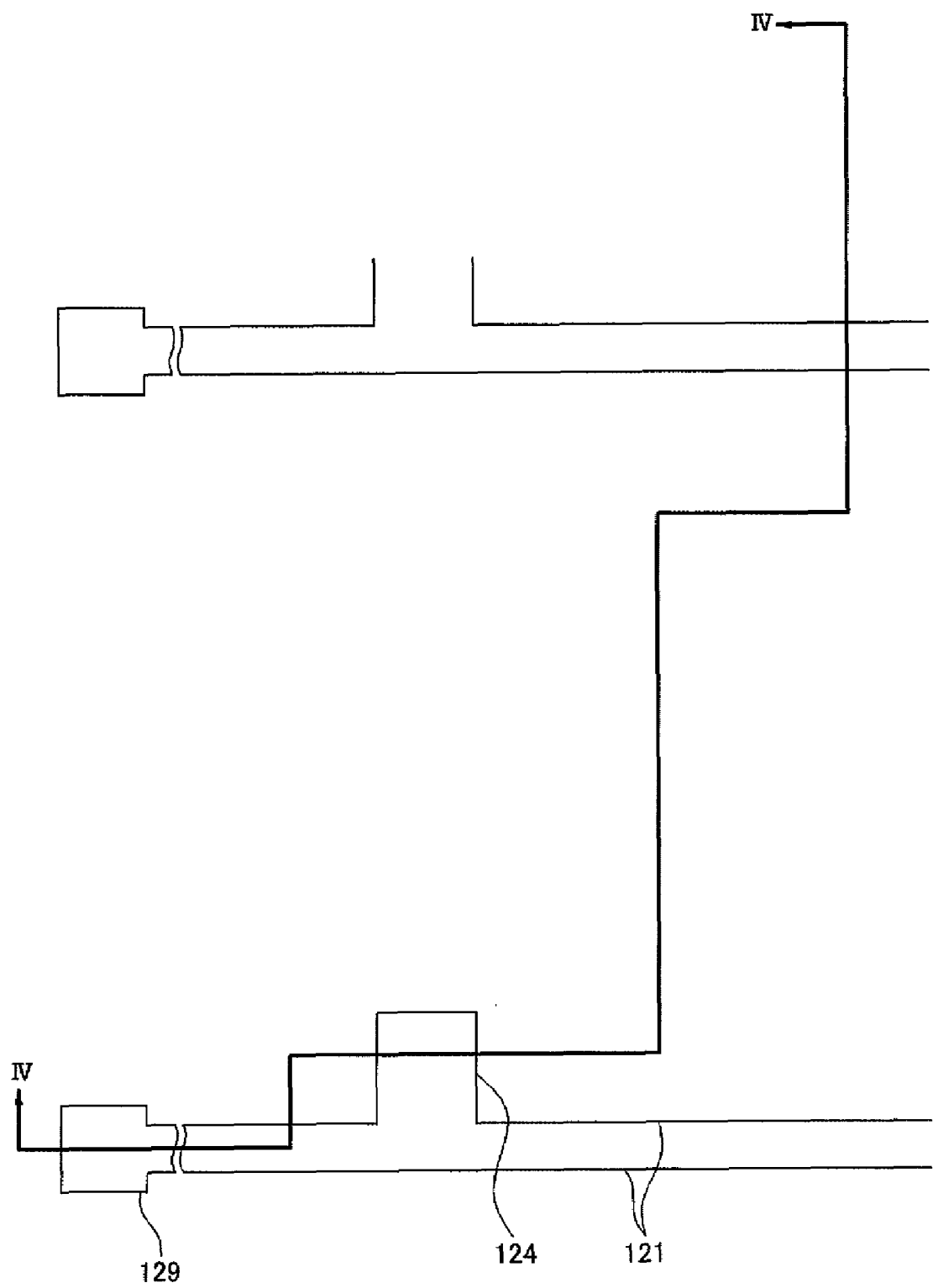
FIG. 3, FIG. 6, FIG. 8, FIG. 12, FIG. 14, and FIG. 16 are layout views showing a method for manufacturing the thin film transistor array panel of FIGS. 1 and 2 according to one exemplary embodiment of the present invention.
Figure 4:
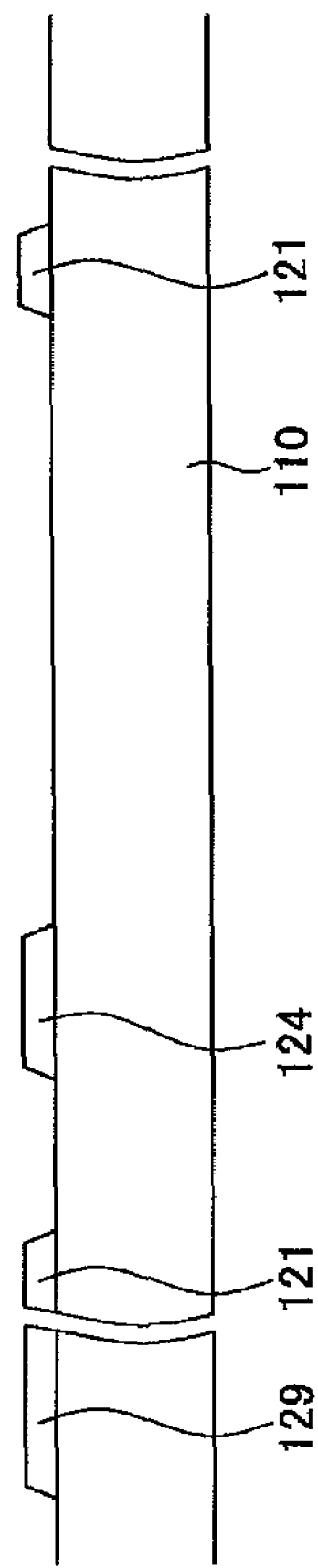
FIG. 4 is a cross-sectional view taken along line IV-IV of the thin film transistor array panel of FIG. 3.
Figure 5:
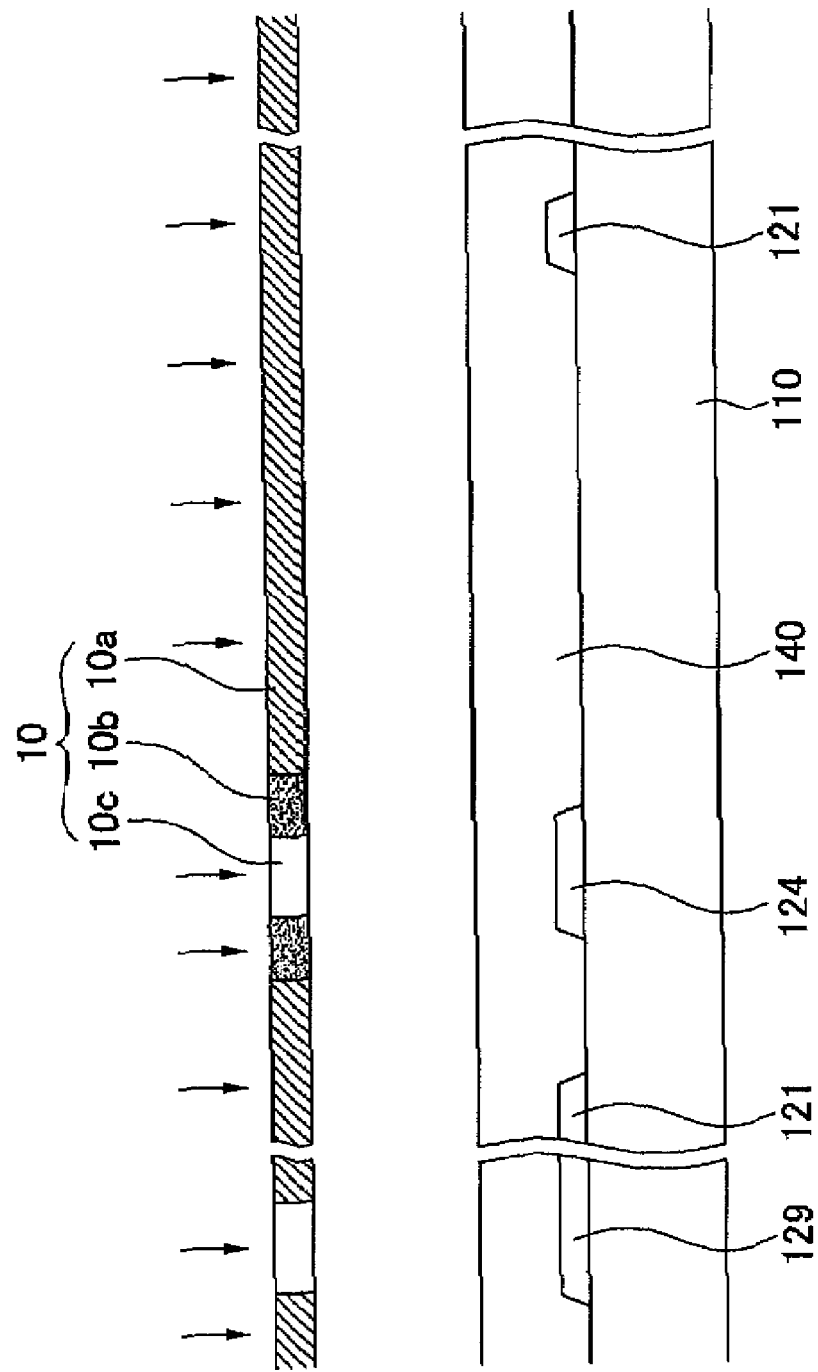
FIG. 5 is a cross-sectional view showing a continuous process of the thin film transistor array panel of FIGS. 3 and 4.

First, referring to FIGS. 3 and 4, a conductive layer is laminated on a substrate 110 by a method such as sputtering, and is photo-etched to form gate lines 121 including gate electrodes 124 and end portions 129.

Next, referring to FIG. 5, an organic material is coated on the substrate 110 to form an interlayer insulating film 140, and a mask 10 is disposed above the interlayer insulating film 140. The mask 10 has a semi-transmissive region 10b, as well as a transmissive region 10c and a shielding region 10a. The semi-transmissive region 10b may have a slit pattern, a lattice pattern, or a thin film(s) with intermediate transmittance or intermediate thickness. When using a slit pattern, it is preferable that the width of the slits or the distance between the slits be smaller than the resolution of the light exposer used for the photolithography.

Figure 6:
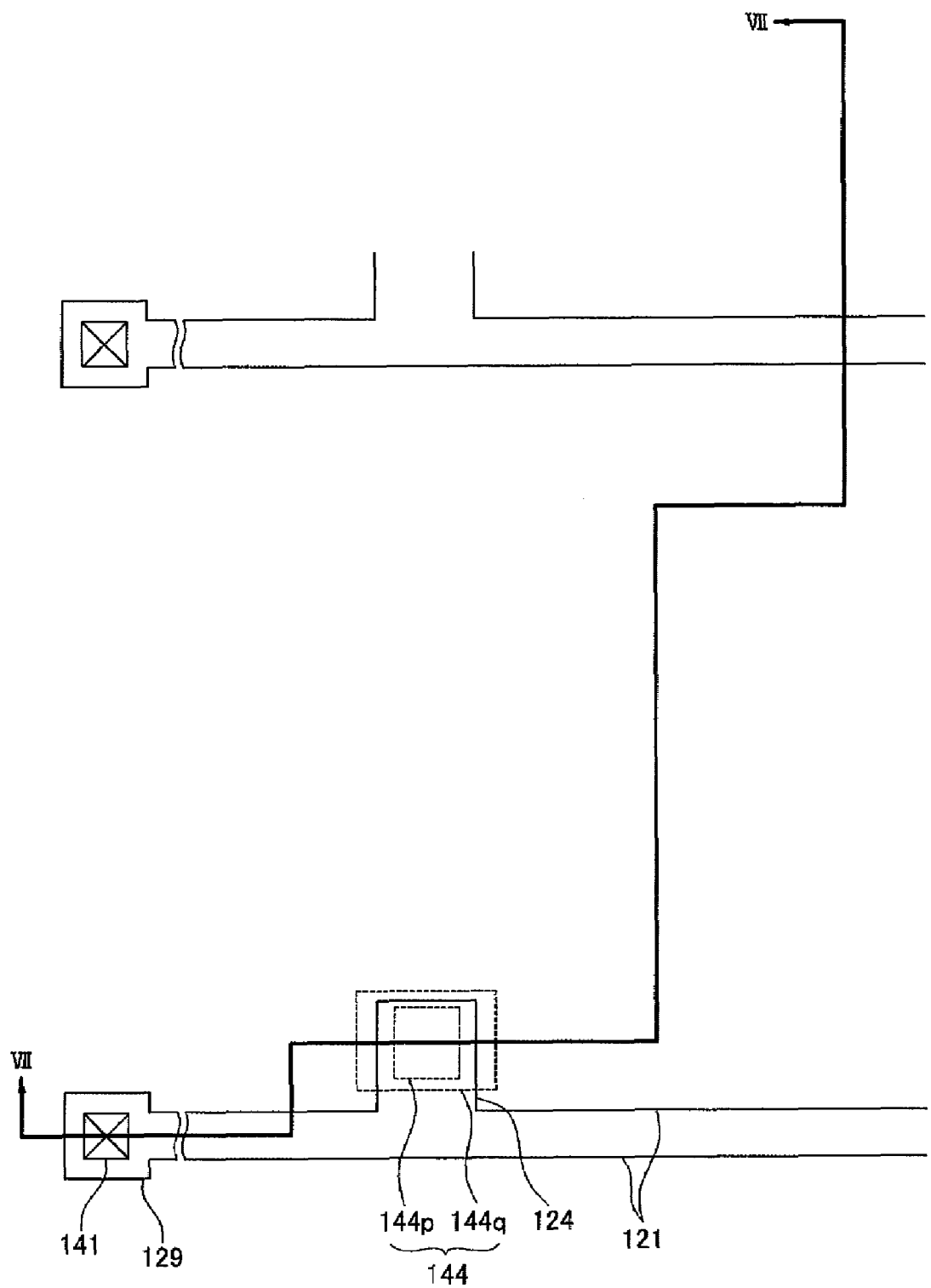
Figure 7:
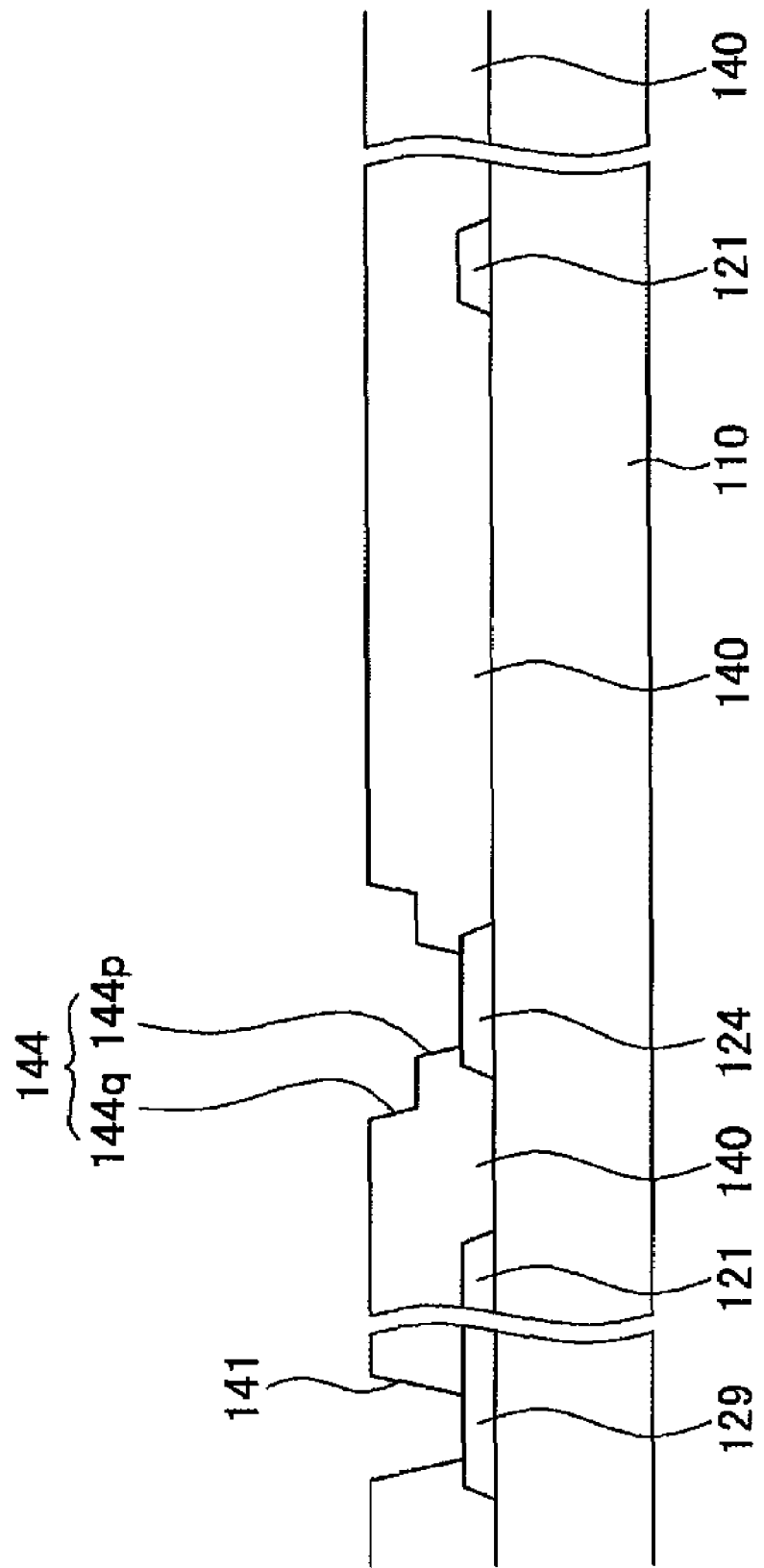
FIG. 7 is a cross-sectional view taken along line VII-VII of the thin film transistor array panel of FIG. 6.

Next, referring to FIGS. 6 and 7, the interlayer insulating film 140 is exposed and developed to form a plurality of openings 144 and contact holes 141. The interlayer insulating film 140 disposed below the transmissive region 10c of the mask 10 is completely removed, and the interlayer insulating film 140 disposed below the semi-transmissive region 10b is partially removed. Therefore, lower openings 144p and contact holes 141 exposing the gate electrodes 124 and the end portions 129 of the gate lines 121, respectively, are formed in the interlayer insulating film 140 disposed below the transmissive region 10c. Upper openings 144q having a smaller depth than the thickness of the interlayer insulating film 140 are formed in the interlayer insulating film 140 disposed below the semi-transmissive region 10b.

Figure 8:
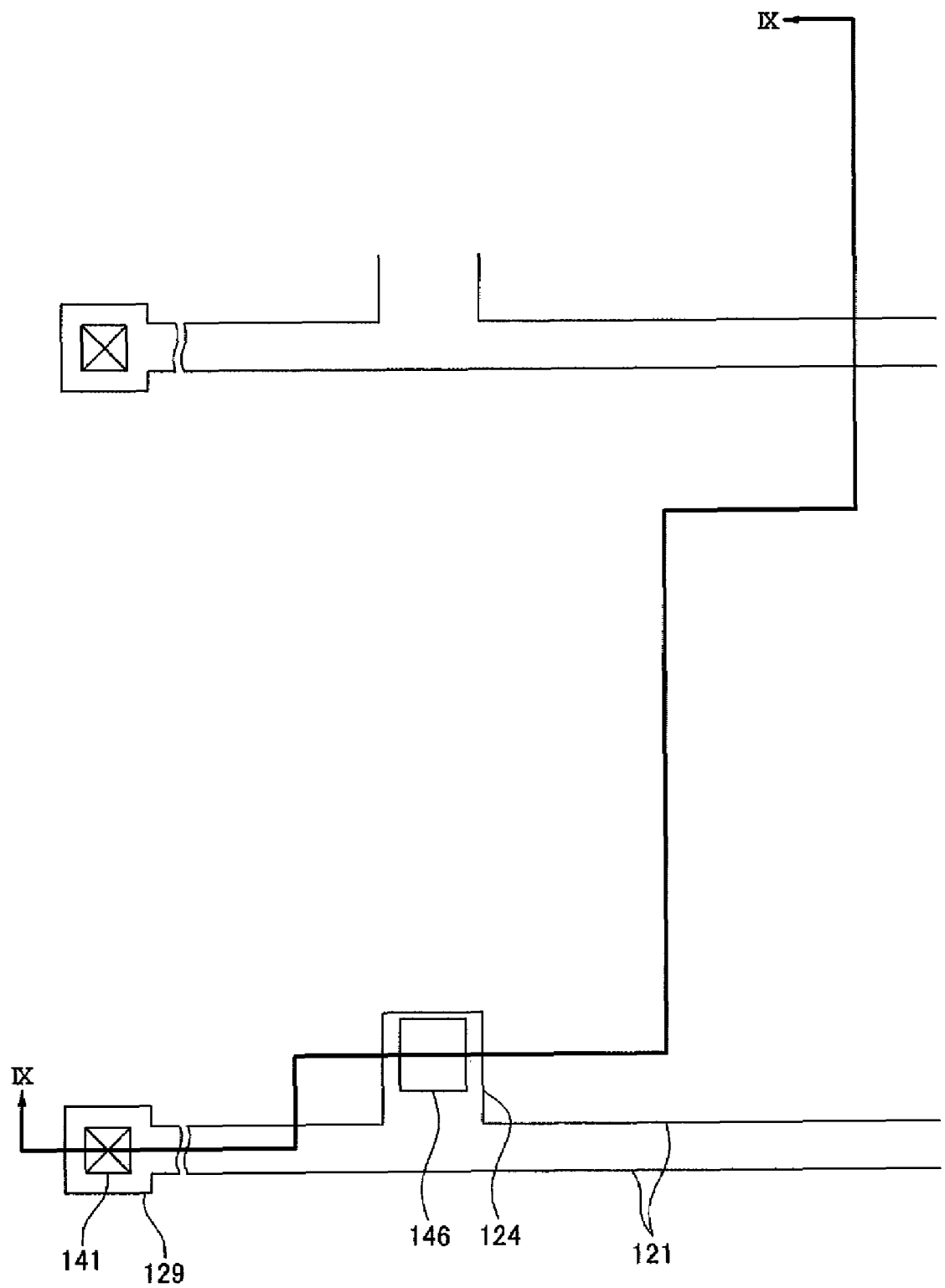
Figure 9:
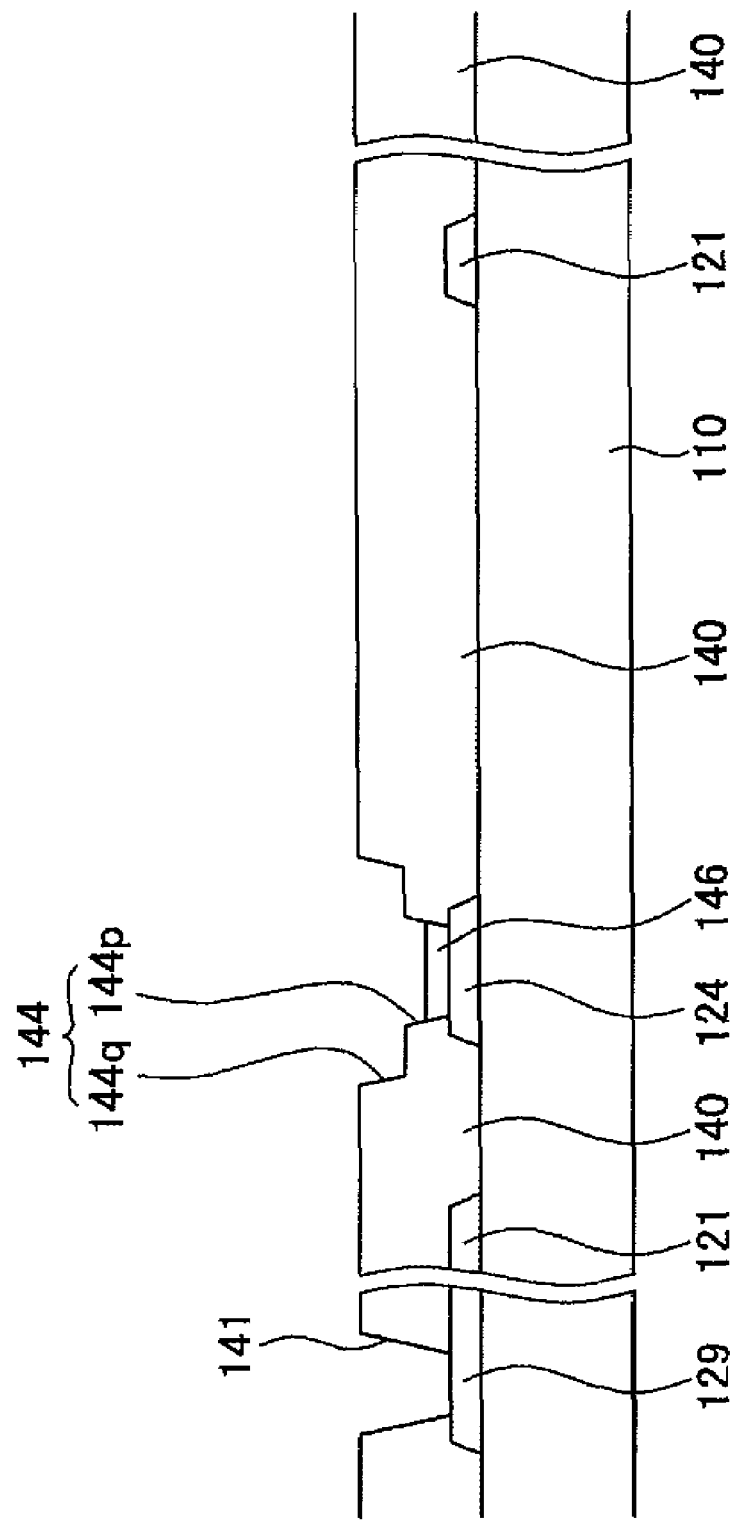
FIG. 9 is a cross-sectional view taken along line IX-IX of the thin film transistor array panel of FIG. 8.

Next, referring to FIGS. 8 and 9, a gate insulator 146 is formed in the lower openings 144p. The gate insulator 146 may be formed by a solution process such as inkjet printing, or by deposition. Among them, inkjet printing is preferable. When forming a gate insulator by inkjet printing, it is necessary to spray a gate insulating solution into the lower openings 144p and dry them while moving an inkjet head (not shown) on the substrate.

Next, referring to FIG. 10, a lower conductive layer 190 and an upper conductive layer 170 are sequentially laminated on the interlayer insulating film 140 and the gate insulator 146. The lower conductive layer 190 may be made of a transparent conductive oxide, such as ITO or IZO. The upper conductive layer 170 may be made of a low resistance metal, such as Al. The transparent conductive oxide and the low resistance metal must have different etching selectivity ratios.

If the lower conductive layer 190 is formed of ITO, the ITO may be amorphous ITO. The amorphous ITO may be formed by sputtering at about 130° C. and below, and preferably at an room temperature. If the amorphous ITO is formed at a relatively low temperature, it prevents the gate insulator 146 that is made of an organic material from being damaged by heat, thereby maintaining excellent film quality.

Continuously, a photoresist film 40 is coated on the upper conductive layer 170, and thereafter a mask 20 having a transmissive region 20c, a shielding region 20a, and a semi-transmissive region 20b is disposed and exposed above the photoresist film 40.

Therefore, as shown in FIG. 11, photoresist patterns 40a and 40b having different thicknesses are formed. A first photoresist pattern 40a is formed on the regions where the data lines 171 are to be formed, excluding the regions where the source electrodes 193 and the end portions 179 are to be formed. A second photoresist pattern 40b having a smaller thickness than the first photoresist pattern 40a is formed on the regions where the source electrodes 193, the end portions 179 of the data lines 171, the pixel electrodes 191, and the contact assistants 81 are to be formed. The ratio of the thickness of the first photoresist pattern 40a and the thickness of the second photoresist pattern 40b differs according to the process conditions of an etching process to be described later. Preferably, the thickness of the second photoresist pattern 40b is less than half the thickness of the first photoresist pattern 40a.

Figure 12:
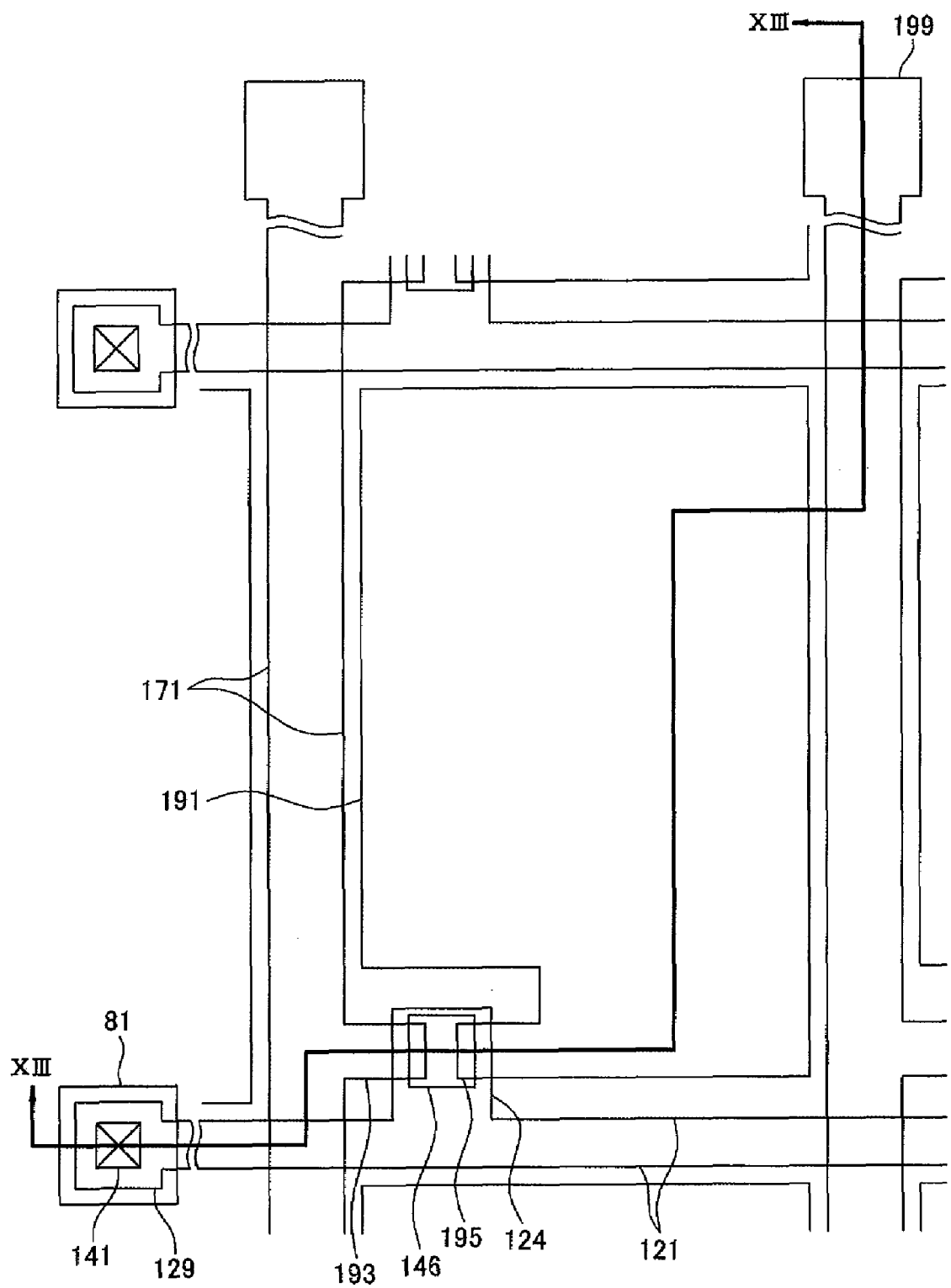
Figure 13:
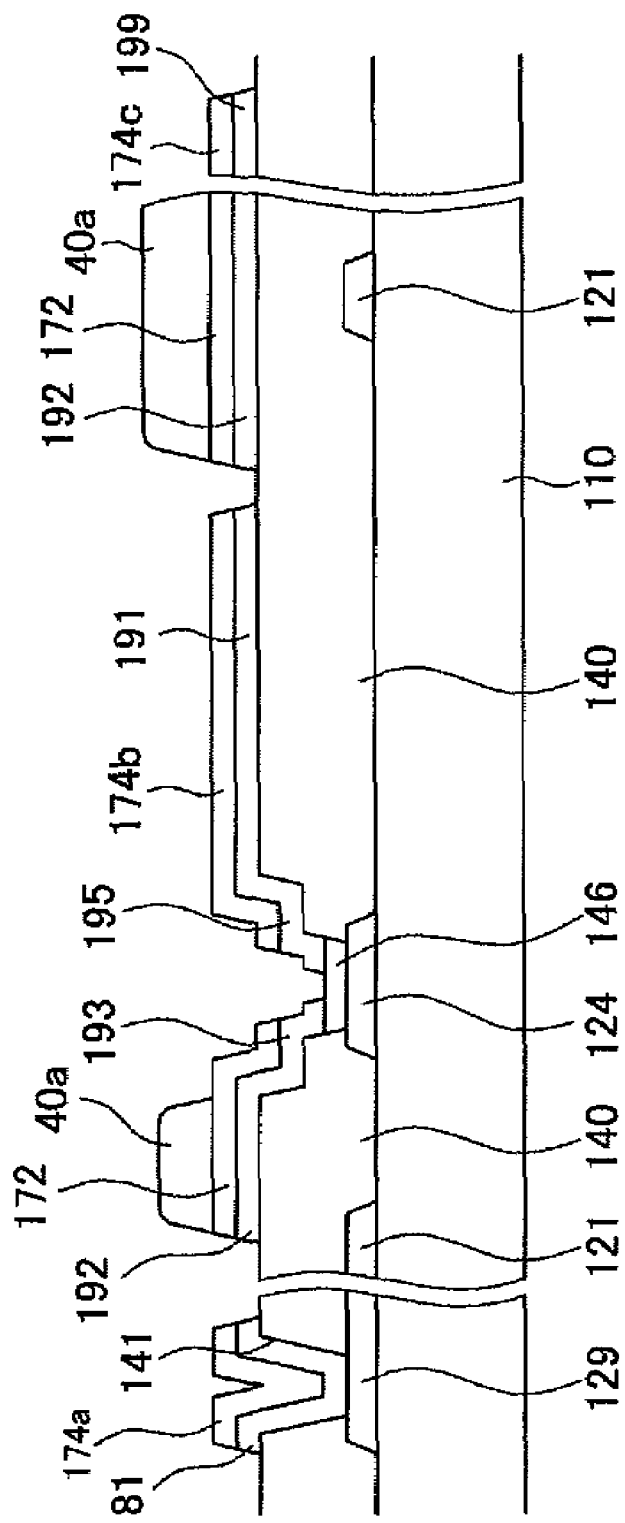
FIG. 13 is a cross-sectional view taken along line XIII-XIII of the thin film transistor array panel of FIG. 12.

Next, referring to FIGS. 12 and 13, the upper conductive layer 170 is wet-etched by using the first and second photoresist patterns 40a and 40b to form an upper data line 172 and a plurality of data members 174a, 174b, and 174c.

Continuously, the second photoresist pattern 40b is removed by an etch-back process such as ashing. At this point, the thickness of the first photoresist pattern 40a is also reduced to a certain extent. In this case, because the gate insulator 146 made of an organic material is covered with the lower conductive layer 190, it is possible to prevent the film quality of the gate insulator 146 from being degraded by plasma and heat exposed in an ashing process. Continuously, the lower conductive layer 190 is wet-etched by using the upper data line 172 and the data members 174a, 174b, and 174c as a mask to form a lower data line 192 including a source electrode 193 and an end portion 199, a pixel electrode 191 including a drain electrode 195, and a contact assistant 81.

Figure 14:
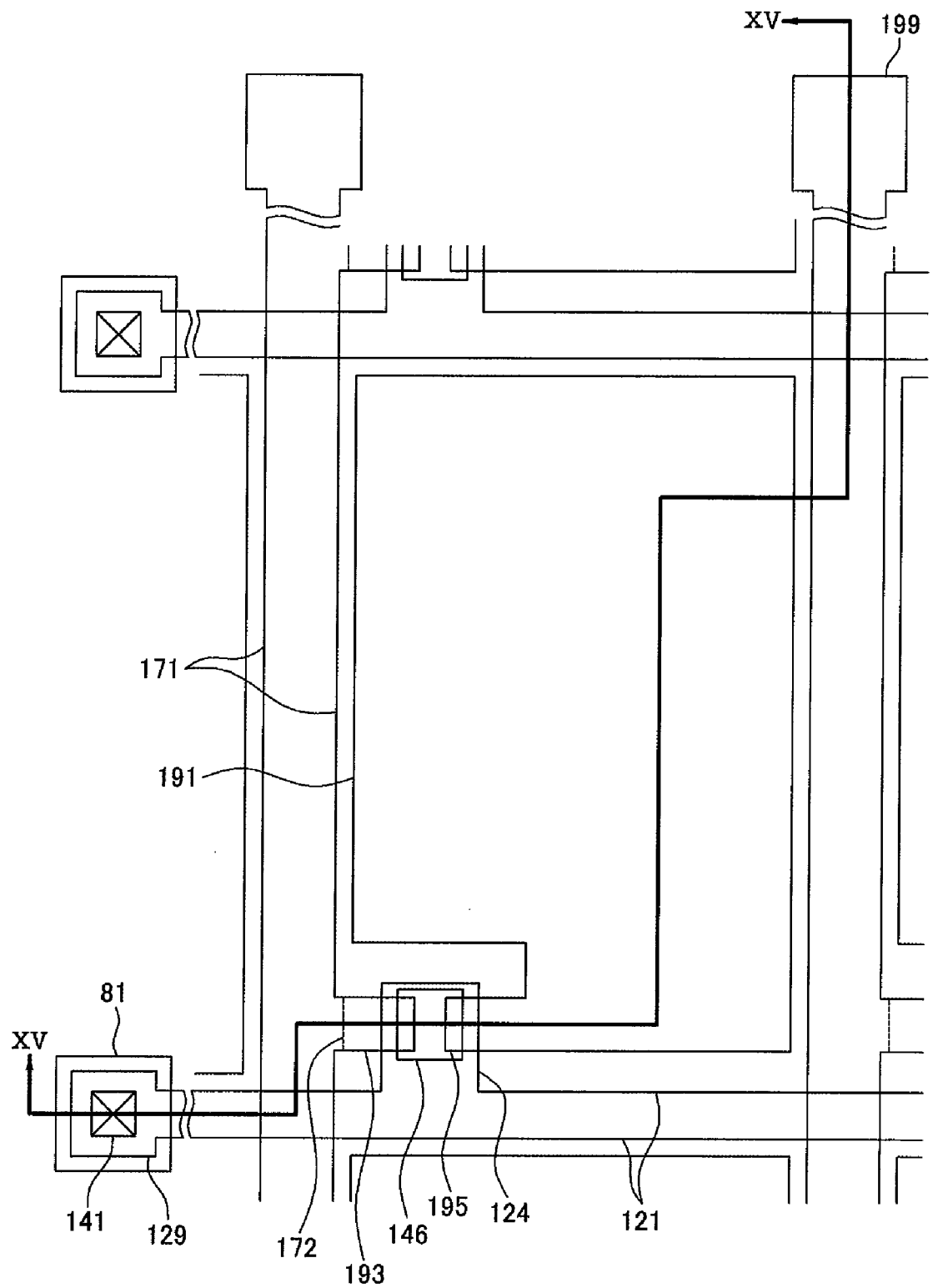
Figure 15:
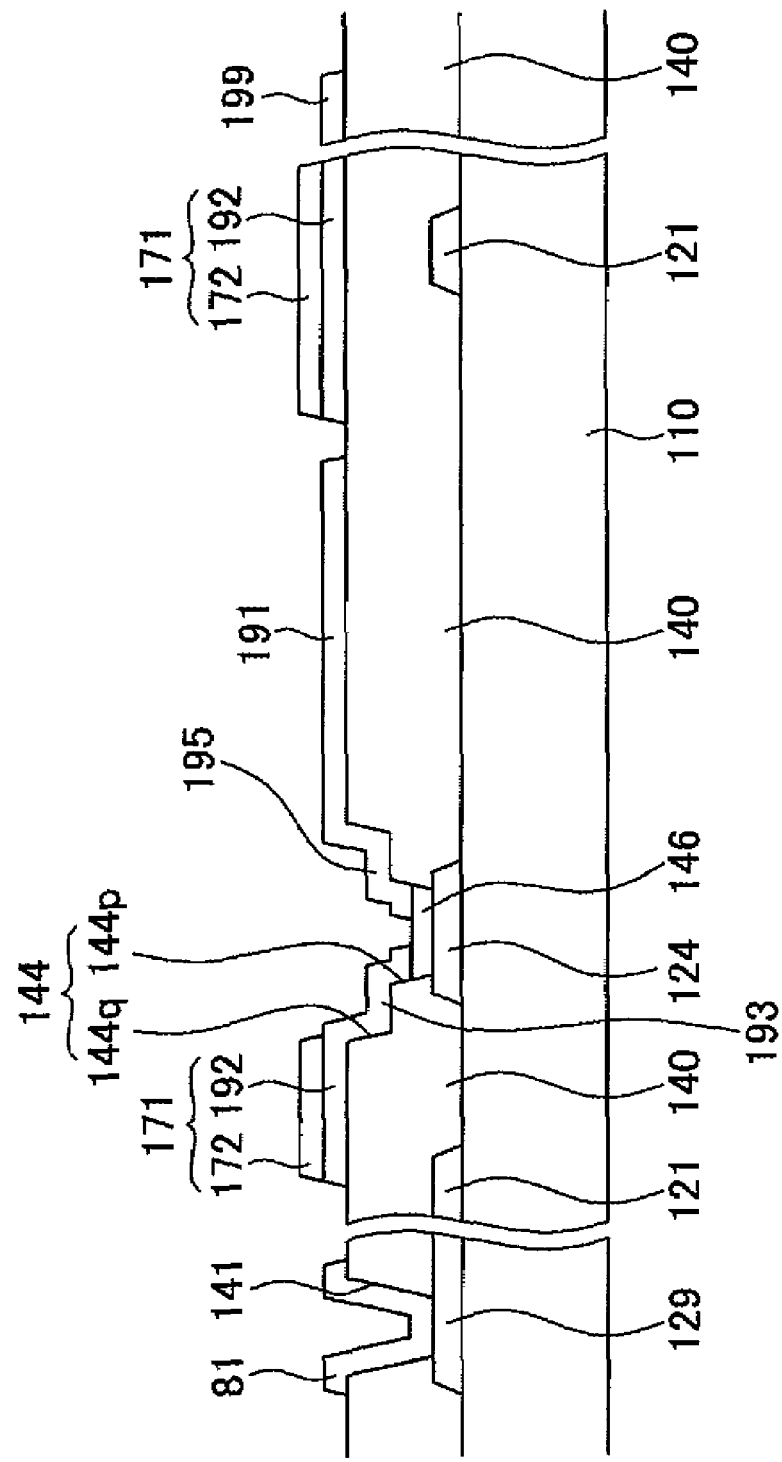
FIG. 15 is a cross-sectional view taken along line XV-XV of the thin film transistor array panel of FIG. 14.

Next, referring to FIGS. 14 and 15, the upper data line 172 and the data members 174a, 174b, and 174c are removed by wet-etching by using the first photoresist pattern 40a as a mask. As a result, the source electrode 193, the end portion 199 of the lower data line 192, and the contact assistant 81 made of a transparent conductive oxide are exposed.

Continuously, the first photoresist pattern 40a is removed.

Figure 16:
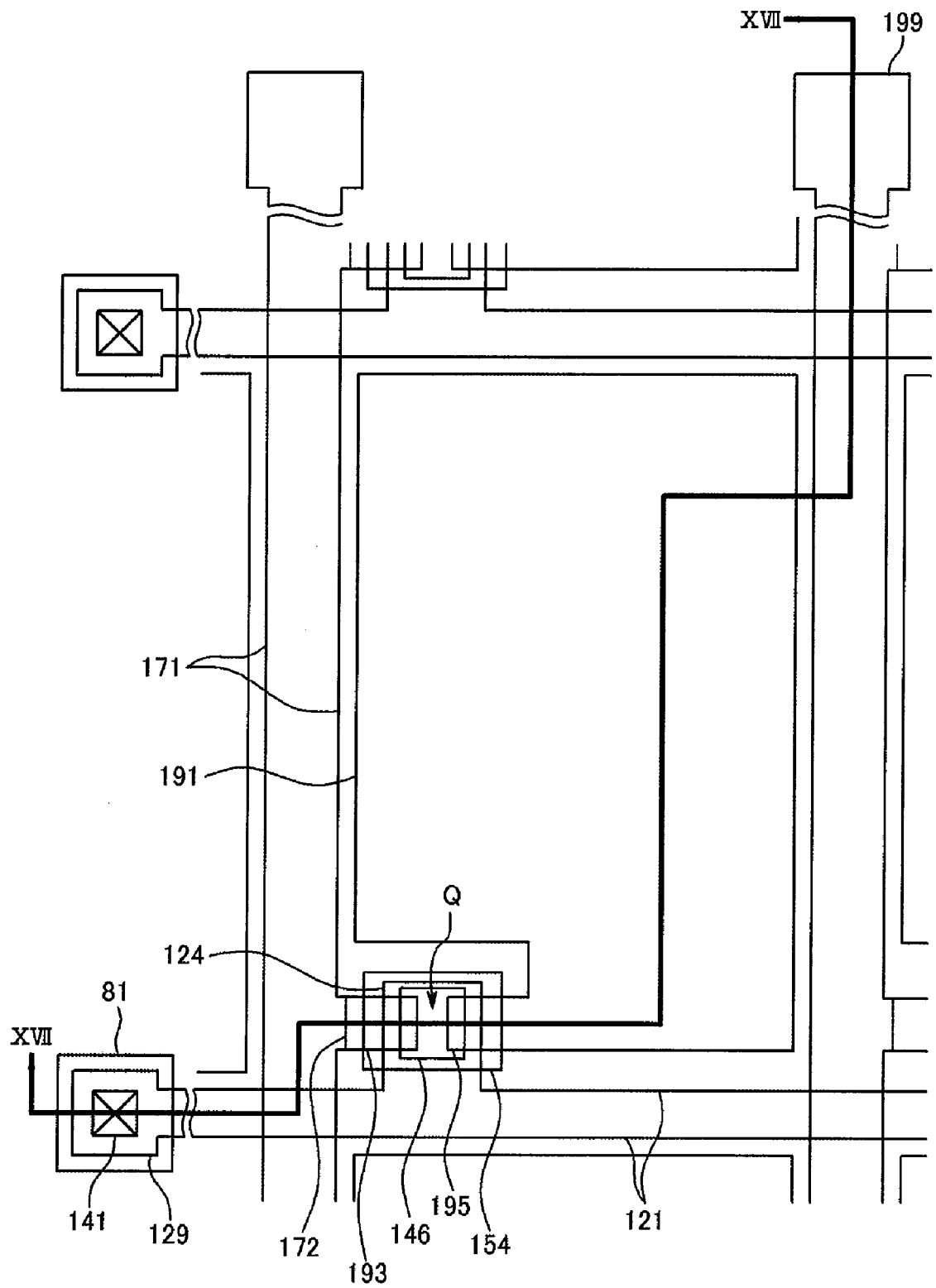
Figure 17:
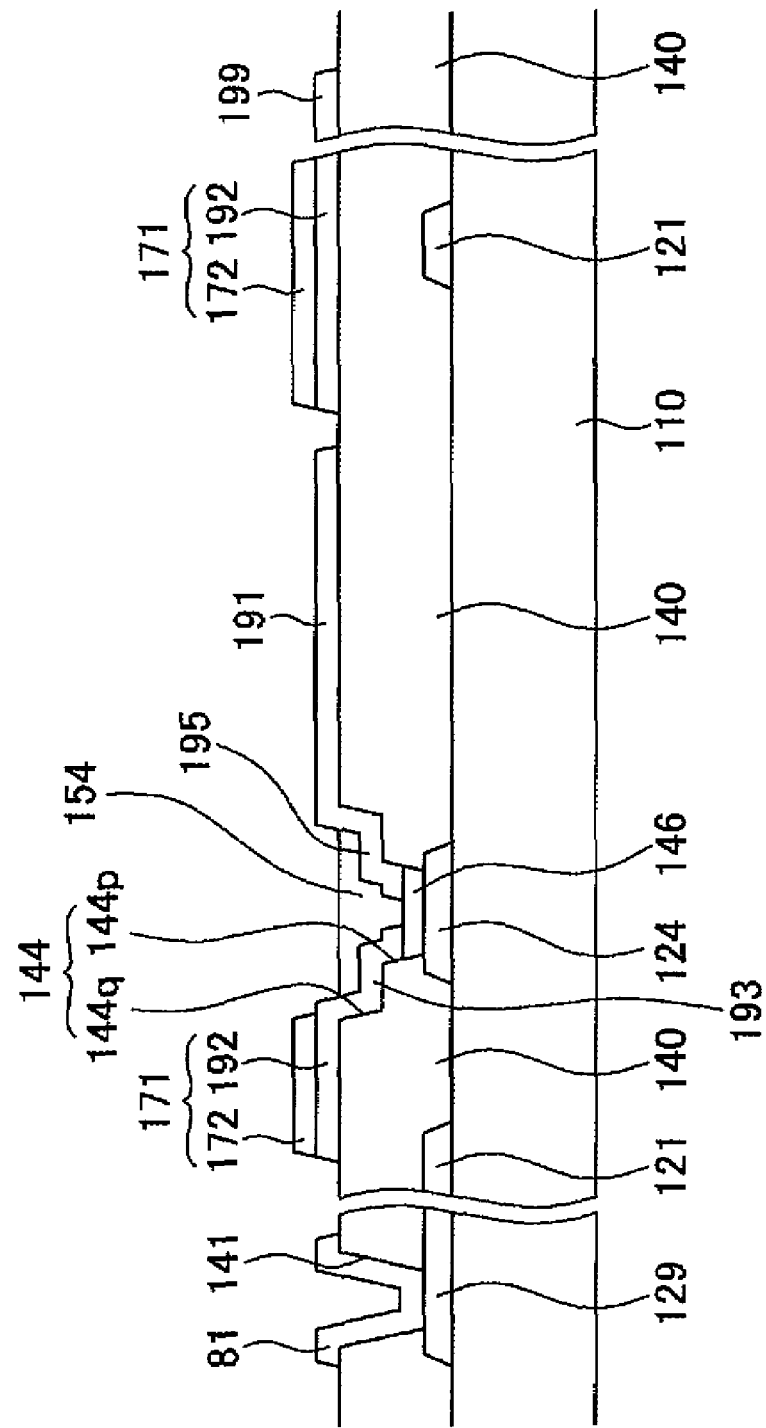
FIG. 17 is a cross-sectional view taken along line XVII-XVII of the thin film transistor array panel of FIG. 16.

Next, referring to FIGS. 16 and 17, an organic semiconductor 154 is formed in the upper openings 144q. The organic semiconductor 154 may be formed by a solution process such as inkjet printing, or be deposition. Among them, inkjet printing is preferable. When forming an organic semiconductor by inkjet printing, it is necessary to spray a gate insulating solution into the upper openings 144q and dry them while moving an inkjet head (not shown) on the substrate.

Finally, as shown in FIGS. 1 and 2, a protective member 180 covering the organic semiconductor 154 is formed.

As above, in one exemplary embodiment of the present invention, only one mask is required to form a data line 171 including a source electrode 193 and a pixel electrode 191 including a drain electrode 195. Subsequently, according to one exemplary embodiment of the present invention, an organic thin film transistor array panel can be manufactured with a total of three masks: a mask required to form a gate line 121, a mask required to form openings 144, and a mask required to form a data line 171 including a source electrode 193 and a pixel electrode 191 including a drain electrode 195.

Furthermore, as described above, the process can be simplified by forming the data line 171 and the pixel electrode 191 using one mask, and signal delay can be reduced when the data line 171 further includes a low resistance metal layer having a different etching selectivity ratio from that of the pixel electrode 191.

Moreover, the characteristics of the organic thin film transistor can be enhanced by making the source electrode 193 and drain electrode 195 that are in direct contact with the organic semiconductor 154 from a material such as ITO that has excellent contact with an organic semiconductor.

The manufacturing cost can be reduced and the process can be simplified by reducing the number of masks used for manufacturing an organic thin film transistor. Further, a signal delay can be prevented, and the characteristics of the organic thin film transistor can be enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
   a gate line formed on a substrate;
   an interlayer insulating film formed on the gate line and having an opening;
   a gate insulator formed in the opening;
   a data line formed on the interlayer insulating film and including a first conductive layer comprising a transparent conductive oxide and a second conductive layer comprising a metal;
   a source electrode connected to the data line and comprising a transparent conductive oxide;
   a drain electrode facing the source electrode and comprising a transparent conductive oxide;
   a pixel electrode connected to the drain electrode; and
   an organic semiconductor contacting the source electrode and the drain electrode.

2. The thin film transistor array panel of claim 1, wherein the transparent conductive oxide is ITO or IZO.

3. The thin film transistor array panel of claim 2, wherein the metal comprises at least one of molybdenum (Mo), a molybdenum alloy, chromium (Cr), a chromium alloy, aluminum (Al), an aluminum alloy, copper (Cu), a copper alloy, silver (Ag), and a silver alloy.

4. The thin film transistor array panel of claim 1, wherein the opening comprises a first opening and a second opening that is larger than the first opening, and the first opening and the second opening may have the gate insulator and the organic semiconductor, respectively, formed therein.

5. The thin film transistor array panel of claim 1, further comprising a protective member covering the organic semiconductor.

6. A thin film transistor array panel, comprising:
   a gate line formed on a substrate and including a gate electrode;
   a data line intersecting the gate line and including a first conductive layer and a second conductive layer;
   a source electrode connected to the data line;
   a pixel electrode including a drain electrode facing the source electrode; and
   an organic semiconductor contacting the source electrode and the drain electrode, wherein the first conductive layer of the data line, the source electrode, and the pixel electrode comprise the same material.

7. The thin film transistor array panel of claim 6, wherein the first conductive layer and the second conductive layer comprise materials with different etching selectivity ratios.

8. The thin film transistor array panel of claim 6, wherein the first conductive layer of the data line, the source electrode, and the pixel electrode comprise a transparent conductive oxide, and the second conductive layer comprises a metal.

9. The thin film transistor array panel of claim 6, further comprising an interlayer insulating film formed between the gate line and the data line, wherein the interlayer insulating film has a first opening and a second opening larger than the first opening.

10. The thin film transistor array panel of claim 9, further comprising a gate insulator formed in the first opening and contacting the gate electrode, the source electrode, and the drain electrode.

11. The thin film transistor array panel of claim 6, wherein the first conductive layer of the data line is disposed on the same layer with the source electrode and the pixel electrode.

* * * * *